United States Patent
Shinoda et al.

(10) Patent No.: US 7,667,973 B2
(45) Date of Patent: Feb. 23, 2010

(54) WATERPROOF CASE

(75) Inventors: Takuya Shinoda, Nagoya (JP);
Takamichi Kamiya, Kasugai (JP);
Keiichi Kato, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 336 days.

(21) Appl. No.: 11/637,241

(22) Filed: Dec. 12, 2006

(65) Prior Publication Data

US 2007/0134981 A1    Jun. 14, 2007

(30) Foreign Application Priority Data

Dec. 14, 2005    (JP)    ............... 2005-360779

(51) Int. Cl.
*H05K 5/06* (2006.01)
(52) U.S. Cl. ............... 361/752; 361/730; 361/728; 174/50; 174/520
(58) Field of Classification Search ........... 174/521, 174/520, 522; 361/752, 730, 728
See application file for complete search history.

(56) References Cited

U.S. PATENT DOCUMENTS

| | | | |
|---|---|---|---|
| 4,666,479 A * | 5/1987 | Shoji | 55/385.4 |
| 5,334,799 A * | 8/1994 | Naito et al. | 174/17 VA |
| 5,872,332 A | 2/1999 | Verma | |
| 6,273,181 B1 * | 8/2001 | Matsui et al. | 165/46 |
| 6,297,448 B1 * | 10/2001 | Hara | 174/559 |
| 6,552,911 B1 | 4/2003 | Mayer et al. | |
| 6,728,110 B2 | 4/2004 | Koyama | |
| 6,800,114 B2 * | 10/2004 | Vanderhoof et al. | 95/117 |
| 6,827,232 B1 * | 12/2004 | Hara et al. | 220/371 |
| 7,189,918 B2 | 3/2007 | Sakata | |
| 7,253,356 B2 * | 8/2007 | Kiyota et al. | 174/17 VA |
| 7,336,489 B1 * | 2/2008 | Chen et al. | 361/700 |
| 7,442,334 B2 | 10/2008 | Hara et al. | |
| 7,514,642 B2 * | 4/2009 | Burca et al. | 200/302.2 |
| 2004/0095732 A1 | 5/2004 | Azumi et al. | |

(Continued)

FOREIGN PATENT DOCUMENTS

DE    100-51-945    10/2000

(Continued)

OTHER PUBLICATIONS

Search Report from European Patent Office, Germany, issued on Mar. 23, 2007 for the corresponding European patent application No. EP06 02 5709.

(Continued)

*Primary Examiner*—Dameon E Levi
(74) *Attorney, Agent, or Firm*—Posz Law Group, PLC

(57) ABSTRACT

A waterproof case for housing an electronic component includes a case member that has a plurality of breathing holes, and a breathable waterproof filter fitted to the case member at a position corresponding to the breathing holes to cover the breathing holes. For example, open surfaces of at least two of the breathing holes, opened outside of the case member, can be made to face in different directions. Furthermore, the breathing hole has an open area on a side of the breathable waterproof filter, which is larger than an open area of the breathing hole on a side opposite to the breathable waterproof filter, in the case member. Accordingly, the waterproof case enhances waterproofness while circulating air between the inside and the outside of the waterproof case.

20 Claims, 4 Drawing Sheets

U.S. PATENT DOCUMENTS

2006/0252501 A1* 11/2006 Little et al. .................... 463/25
2006/0262501 A1* 11/2006 Huang ........................ 361/694
2007/0101730 A1* 5/2007 Chen et al. ....................... 62/6

FOREIGN PATENT DOCUMENTS

| EP | 1 806 960 | 7/2007 |
|----|-----------|--------|
| GB | 2 314 920 | 1/1998 |
| JP | A-11-111381 | 4/1999 |
| JP | A-2000-114733 | 4/2000 |
| JP | A-2001-024348 | 1/2001 |
| JP | A-2002-216886 | 1/2001 |
| JP | A-2001-128272 | 5/2001 |
| JP | A-2001-237577 | 8/2001 |
| JP | A-2002-246762 | 8/2002 |
| JP | A-2005-243829 | 9/2005 |
| JP | 2006005162 A * | 1/2006 |
| JP | 2007141959 A * | 6/2007 |

OTHER PUBLICATIONS

Extended Search Report and citations dated Nov. 23, 207 in corresponding European Patent Application No. 06025707.8.

Extended Search Report dated Feb. 5, 2009 in corresponding European patent application No. 06025746.6-1242 (and English translation).

Examination Report dated Feb. 6, 2009 in related European patent application No. 06025709.4-2214 (and English translation).

* cited by examiner

WATERPROOF CASE

CROSS REFERENCE TO RELATED APPLICATION

This application is based on Japanese Patent Application No. 2005-360779 filed on Dec. 14, 2005, the contents of which are incorporated herein by reference in its entirety.

FIELD OF THE INVENTION

The present invention relates to a waterproof case with a waterproof structure, for housing an electronic component.

BACKGROUND OF THE INVENTION

In a waterproof case with a waterproof structure disclosed in JP-A-11-111381, a cover is provided with a filter fitting part. This filter fitting part is provided with a filter breathing hole, a filter welding surface to which a filter is welded and which is formed so as to surround the periphery of this filter breathing hole, and a projection for forming the filter fixing part. A water-repellent filter is placed on the filter welding surface and is rounded inside while the projection is melted to form the filer fixing part, thereby being fixed.

As described above, by providing the filter breathing hole formed in the cover with the water-repellent filter, it is possible to hold the waterproofness of the case and to circulate air between the inside and the outside of the case. However, in the waterproof case described in JP-A-11-111381, there is a possibility that when the case is covered with water, water will be collected in a depression formed by the water-repellent filter and the filter fixing part. In a state where water is collected in the depression in this manner, there is a possibility that water will soak into the water-repellent filter, thereby the water may enter into the inside of the waterproof case. Moreover, when the filter breathing hole is closed with water and the inside or outside temperature of the case is changed, the inside of the case may be brought into a negative pressure so as to cause water to be drawn into the case.

SUMMARY OF THE INVENTION

In view of the foregoing problems, it is an object of the present invention to provide a waterproof case capable of enhancing the waterproofness of a case member and circulating air between an inside and an outside of the case member.

According to an aspect of the present invention, a waterproof case for housing an electronic component includes a case member that has a plurality of breathing holes, and a breathable waterproof filter fitted to the case member at a position corresponding to the breathing holes to cover the breathing holes. By forming the plurality of breathing holes and providing the breathable waterproof filter at the position corresponding to these breathing holes, it is possible to reduce a possibility that all breathing holes will be closed by water. Hence, a water amount impregnated in the waterproof filter and drawn into the waterproof case due to a negative pressure can be effectively reduced.

For example, open surfaces of at least two of the breathing holes, opened outside of the case member, may be made to face in different directions. Alternatively, the breathing holes may be opened in at least two wall surfaces of a plurality of wall surfaces of the case member. Furthermore, each of the wall surfaces may be provided with at least one breathing hole. Accordingly, it can reduce a possibility that all breathing holes are closed at the same time by the water.

Alternatively, the breathing holes may be opened in at least two opposite wall surfaces of the case member, or may be provided at different positions in a direction perpendicular to a horizontal direction of the electronic component mounted in the case member. The breathing hole may have an open area on a side of the breathable waterproof filter, which is larger than an open area of the breathing hole on a side opposite to the breathable waterproof filter, in the case member. Alternatively, the case member may have a triangular pyramid portion projecting to an outside of the case member. In this case, the triangular pyramid portion may be provided with an opening at a bottom part to form the breathing hole. Alternatively, the case member may have a wall portion defining a circular projecting groove projecting to an outside of the case member. In this case, the breathing hole is provided in the wall portion and has an opening at an outside of the circular projecting groove.

Furthermore, the breathing holes may be through holes penetrating through a wall portion of the case member, and the waterproof filter may be a sheet member that covers one-side openings of the through holes.

Each of the breathing holes can have a dimension capable of passing through water. Even in this case, the waterproof filter can be provided such that gas communicates with each other between an inside of the case member and an outside of the case member through the waterproof filter and at least one of the breathing holes. Accordingly, it can restrict the negative pressure from being caused in the waterproof case, thereby improving the waterproofness of the waterproof case.

BRIEF DESCRIPTION OF THE DRAWINGS

Additional objects and advantages of the present invention will be more readily apparent from the following detailed description of preferred embodiments when taken together with the accompanying drawings.

DETAILED DESCRIPTION OF THE PREFERRED EMBODIMENTS

Figure 1:
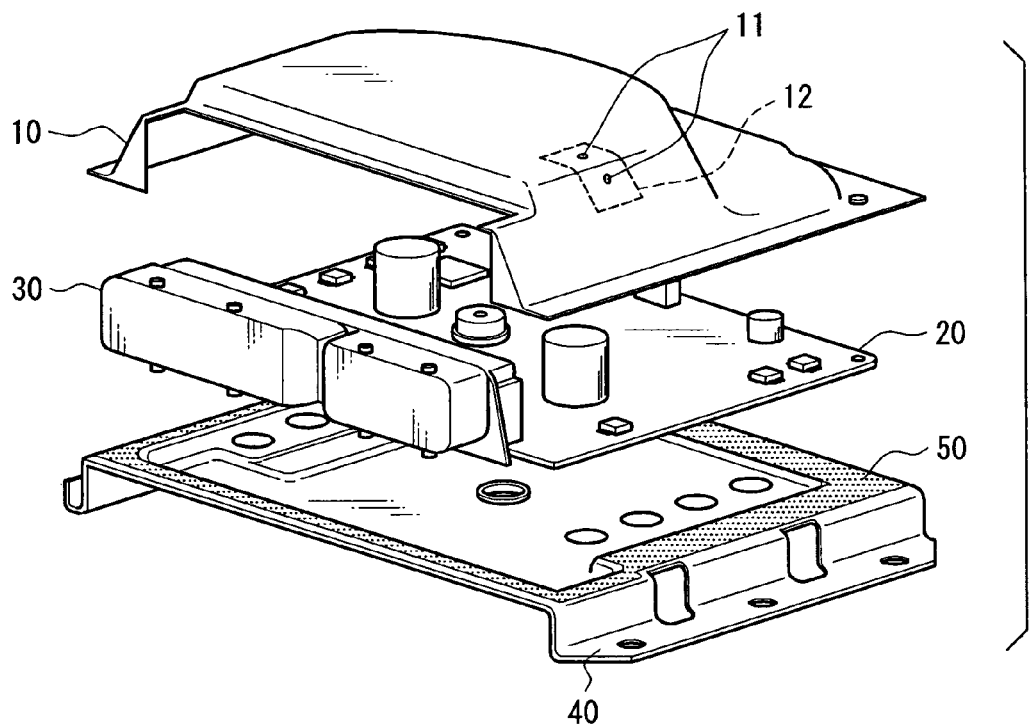
FIG. 1 is a disassembled perspective view showing a schematic construction of a waterproof case according to an embodiment of the present invention.
Figure 2:
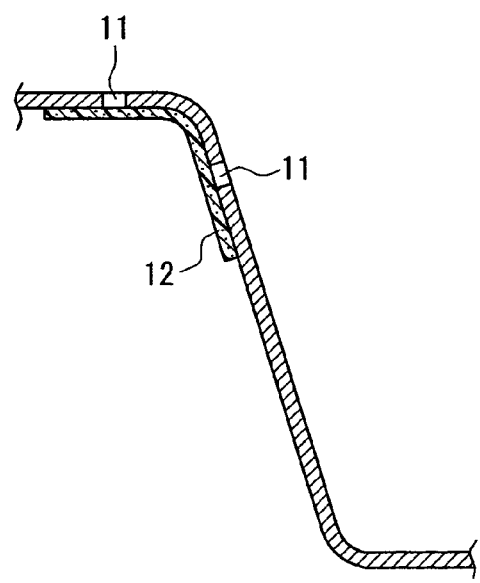
FIG. 2 is a cross-sectional view showing a schematic construction of a waterproof case with a breathing hole in the embodiment of the present invention.

Hereinafter, an embodiment of the present invention will be described on the basis of the drawings. FIG. 1 is a disassembled perspective view showing the schematic construction of a waterproof case according to the embodiment of the present invention. FIG. 2 is a cross-sectional view showing the schematic construction of the waterproof case with a breathing hole of the embodiment of the present invention. Here, the waterproof case with a waterproof structure according to this embodiment can be suitably used for an engine ECU (Electronic Control Unit) of a vehicle, as an example.

As shown in FIG. 1, the waterproof case houses a circuit substrate (electronic component) 20, and includes a cover member 10 and a base member 40. The cover member 10 and the base member 40 are made of, for example, aluminum, resin or the like. The cover member 10 has a plurality of breathing holes 11 and a waterproof filter 12, which are characteristic parts of the present embodiment. Moreover, the cover member 10 and the base member 40 are provided with a sealing portion 50 (e.g., sealing agent) for preventing an entry of water into the inside of the waterproof case from its connection portion. Here, in FIG. 1, the sealing portion 50 is shown on the base member 40. As to the cover member 10, the sealing portion 50 is formed on its portion in contact with a connector 30 although not shown.

The circuit substrate 20 is constructed of: a board having wiring patterns (not shown) and via holes for connecting the wiring patterns formed thereon; and circuit elements such as microcomputer, power transistor, resistance, capacitor, and connector mounted on the board, thereby forming an electronic control device. Moreover, the circuit substrate 20 is mounted with the connector 30 for electrically connecting the circuit substrate 20 to the outside.

In the waterproof case of this embodiment, the cover member 10 is connected to the connector 30, the connector 30 is connected to the base member 40, and the base member 40 is connected to the cover member 10, via the sealing portion 50, so as to house the circuit substrate 20 in a waterproof state.

The breathing holes 11 and the waterproof filter 12 will be described in detail.

These breathing holes 11 are through holes penetrating through the wall portion of the cover member 10. The breathing holes 11 are formed in such a way that when the inside or outside temperature of the waterproof case is changed and hence the inside or outside atmospheric pressure of the waterproof case is changed, the inside atmospheric pressure and the outside atmospheric pressure of the waterproof case are brought into the nearly same level to thereby prevent the cover member 10 and the base member 40 from being deformed.

Moreover, when the circuit substrate 20 is used for the engine ECU of a vehicle, an atmospheric pressure sensor is generally mounted to the circuit substrate 20. The atmospheric pressure sensor mounted on the circuit substrate 20 cannot measure an atmospheric pressure suitably in a state where the inside atmospheric pressure of the waterproof case is different from the outside atmospheric pressure of the waterproof case. Hence, the waterproof case of this embodiment is used for bringing the inside atmospheric pressure of the waterproof case and the outside atmospheric pressure of the waterproof case into the nearly same level.

Therefore, the breathing holes 11 are formed as through holes passing though the wall surface of the waterproof case. For example, in cases where the waterproof case is formed of aluminum or the like, when the cover member 10 is formed by pressing an aluminum plate, the breathing holes 11 can be formed in the same pressing process and hence can be formed easily without increasing a particular process. Moreover, for example, when the waterproof case is formed of resin or the like, the breathing holes 11 can be formed also by drilling holes in the cover member 10 by a mechanical drilling machine such as drill.

In contrast to this, the waterproof filter 12 is used for preventing the waterproofness of the waterproof case from being reduced by the breathing holes 11 for adjusting the atmospheric pressure. This waterproof filter 12 is a sheet member that is subjected to water-repellent processing to have a breathing property and a waterproof property to thereby pass gas such as air but not to pass liquid such as water.

The breathing holes 11, as shown in FIG. 1, are formed at two positions of the cover member 10, for example. The waterproof filter 12 is provided at a position corresponding to these breathing holes 11. As shown in FIG. 2, this waterproof filter 12 is fitted to an inside surface of the cover member 10 so as to cover the openings of the breathing holes 11.

In this manner, by forming the breathing holes 11 at plural positions (e.g., two positions) of the cover member 10, even when the waterproof case is covered with water, it is possible to reduce a possibility that all breathing holes 11 will be closed by the water to bring the waterproof case into a negative pressure. Moreover, by providing the waterproof filter 12 at the position corresponding to the breathing holes 11, it is possible to enhance waterproofness of the waterproof case and at the same time to circulate air between the inside and the outside of the waterproof case. Furthermore, by fitting the waterproof filter 12 to the inside of the cover member 10, it is possible to reduce a possibility that the waterproof filter 12 will come off.

The waterproof case of this embodiment can enhance waterproofness and can circulate air between the inside and the outside of the waterproof case. Accordingly, the waterproof case of this embodiment can be suitably used as a waterproof structure provided (packaged) with an atmospheric pressure sensor and for housing the circuit substrate 20 that is applied to the engine ECU and the like of the vehicle.

As shown in FIG. 1 and FIG. 2, by forming the breathing holes 11 in at least two surfaces of a plurality of surfaces constructing the waterproof case, even when the waterproof case is covered with water, it is possible to reduce a possibility that all of the breathing holes 11 will be closed with the water. That is, by arranging the breathing holes 11 in at least two surfaces that are not on the same surface, all of the breathing holes 11 do not closed by the water even when one surface of the waterproof case is covered with water.

In this embodiment, the breathing holes 11 and the waterproof filter 12 are provided on the respective surfaces forming an angle. Hence, even when the waterproof case is covered with water in the state of usual use, it is possible to sufficiently reduce a situation to cause a state where the respective breathing holes 11 and the waterproof filter 12 are covered with water at the same time and where the breathing holes 11 are completely closed with the water.

As shown in FIG. 1 and FIG. 2, by constructing the waterproof filter 12 of a single sheet member, it is possible to reduce cost. Moreover, when the waterproof filter 12 is constructed of a single sheet member, by forming the breathing holes 11 close to each other, the mounting area of the waterproof filter 12 can be reduced.

By forming the breathing holes 11 in surfaces opposite to each other among a plurality of surfaces constructing the waterproof case, even when the waterproof case is covered with water, it is possible to further reduce a possibility that all the breathing holes 11 will be closed with the water.

The breathing holes 11 may be formed at positions of different levels in a vertical direction in a state where the waterproof case is packaged on a body to be packaged. In cases where the breathing holes 11 are formed in this manner, even when a part of the waterproof case is dipped in water, it is possible to reduce a possibility that the breathing holes 11 will be closed by the water to bring the waterproof case into a negative pressure.

The area of an opening of the breathing hole 11 (i.e., the area of the inside opening of the waterproof case) on a side of the waterproof filter 11 can be made larger than the area of the breathing hole 11 (outside opening) on the outside of the waterproof case. In this case, it is possible to easily ensure waterproofness and a breathing area. For example, the dimension (e.g., diameter) of the outside opening of the waterproof case of the breathing hole 11 is made smaller than the thickness of the wall of the waterproof case, and the dimension (e.g., diameter) of the opening of the breathing hole 11 on the side of the waterproof filter 11 is made larger than the thickness of the wall of the waterproof case. By making the dimension of the outside opening of the waterproof case of the breathing hole 11 smaller than the thickness of the wall of the waterproof case, water is hard to enter into the breathing hole 11. By making the area of the opening of the breathing hole 11 on the side of the waterproof filter 11 larger than the thickness of the wall of the waterproof case, breathing ability of the waterproof case can be enhanced.

While an example in which the breathing holes 11 and the waterproof filter 12 are provided at two positions in this embodiment, the present invention is not limited to this. The object of the present invention can be achieved by providing the waterproof case with a plurality of breathing holes 11 and by providing the waterproof filter 12 at a position corresponding to the breathing holes 11. Generally, the waterproof filter 12 is provided on the inner surface of the waterproof case to cover all the breathing holes 11.

For example, in cases where the breathing holes 11 are formed in at least two or more different surfaces among the plurality of surfaces constructing the waterproof case, by forming a plurality of breathing holes 11 in the respective surfaces, it is possible to further reduce a possibility that the breathing holes 11 will be closed by the water and to easily make the inside atmospheric pressure of the waterproof case equal to the outside atmospheric pressure of the waterproof case, even when the waterproof case is covered with water.

The embodiment of the present invention can be suitably modified as in the following examples.

EXAMPLE 1

Next, an example 1 of the waterproof case will be described with reference to FIG. 3 and FIG. 4.

Figure 3:
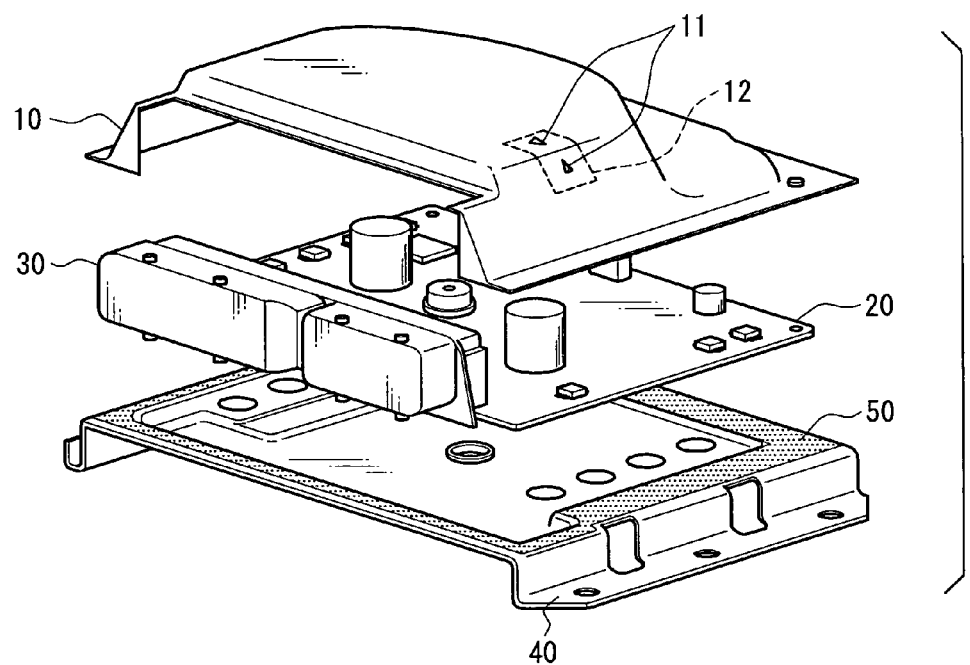
FIG. 3 is a disassembled perspective view showing a schematic construction of the waterproof case in an example 1 of the embodiment.
Figure 4:
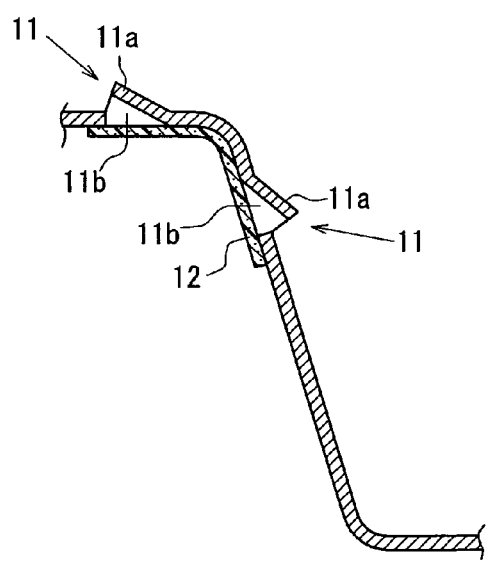
FIG. 4 is a cross-sectional view showing the schematic construction of a breathing hole in the example 1 of the embodiment.

In the example 1, as shown in FIG. 3 and FIG. 4, the opening 11a of the breathing hole 11 is formed at the bottom surface of a triangular pyramid projecting to the outside of the cover member 10. In this manner, by forming the opening 11a of the breathing hole 11 at the bottom surface of a triangular pyramid projecting to the outside of the cover member 10, it is possible to reduce a possibility that the opening 11a is covered with water from a part other than the bottom surface of the triangular pyramid. That is, the portion other than the bottom surface of the triangular pyramid acts as the cover of the opening 11a. This can reduce a possibility that the opening 11a will be covered with water.

The waterproof case is different in a direction in which it is easily covered with water depending on use. Hence, by packaging the waterproof case on a body to be packaged in such a way that the portion other than the bottom surface of the triangular pyramid is arranged in a direction in which the waterproof case is easily covered with water, it is possible to further reduce a possibility that all the breathing holes 11 will be closed by water. For example, when the waterproof case is used for the engine ECU of the vehicle, the engine ECU may be covered with water from above the vehicle when the vehicle is washed with water. Hence, by mounting the waterproof case in the engine room with the bottom surface of the triangular pyramid downward, it can further reduce the possibility that the breathing holes 11 will be closed by water.

Moreover, in this example 1, by forming the opening 11a of the breathing hole 11 in the bottom surface of the triangular pyramid, it is possible to easily make the area of an opening 11b on the side of the waterproof filter 12 larger than the opening 11a of the breathing hole 11 outside of the waterproof case.

EXAMPLE 2

Next, an example 2 of the waterproof case will be described with reference to FIG. 5 and FIGS. 6A and 6B.

Figure 5:
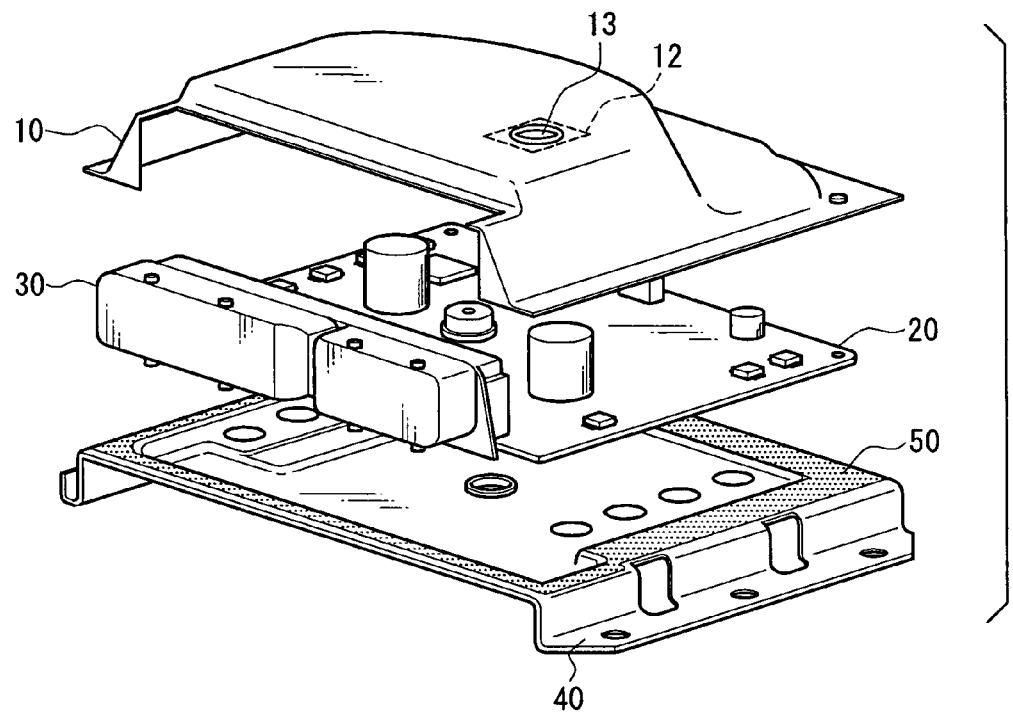
FIG. 5 is a disassembled perspective view showing a schematic construction of a waterproof case in an example 2 of the embodiment.
Figure 6A:
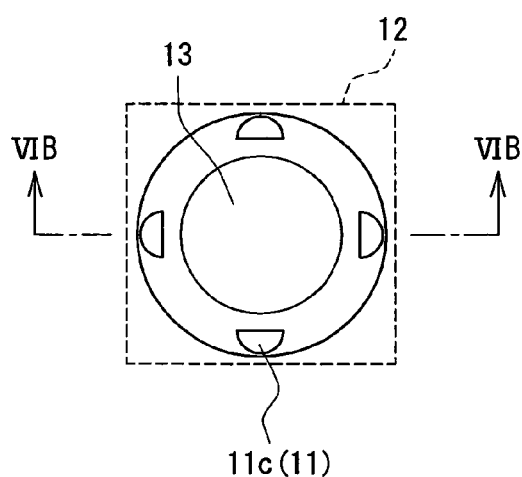
FIG. 6A is a schematic top view showing a part of the waterproof case with a breathing hole in the example 2 of the embodiment.
Figure 6B:
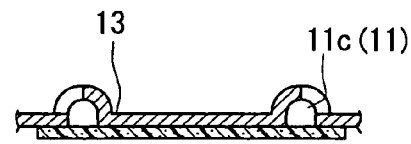
FIG. 6B is a cross-sectional view taken along the line VIB-VIB in FIG. 6A.

In the example, 2, as shown in FIG. 5 and FIGS. 6A and 6B, openings 11c of the breathing holes 11 are formed at an outside of a circular projecting groove 13 projecting outside the cover member 10. In this manner, by forming the openings 11c of the breathing holes 11 outside of the circular projecting groove 13 projecting outside the cover member 10, even when the waterproof case is covered with water, the water easily flows along the circular projecting groove 13, which hence can reduce a possibility that the breathing holes 11 will be closed by the water.

Further, as shown in FIG. 5 and FIGS. 6A and 6B, by forming the openings 11c of the breathing holes 11 in four outside directions of the circular projecting groove 13, it is possible to further reduce a possibility that the breathing holes 11 will be closed by water. That is, even when the openings 11c in three directions of the openings 11c among the four directions are covered with water, the breathing hole 11 is not closed by the water.

Other Embodiments

Although the present invention has been fully described in connection with the preferred embodiments thereof with reference to the accompanying drawings, it is to be noted that various changes and modifications will become apparent to those skilled in the art.

Figure 7:
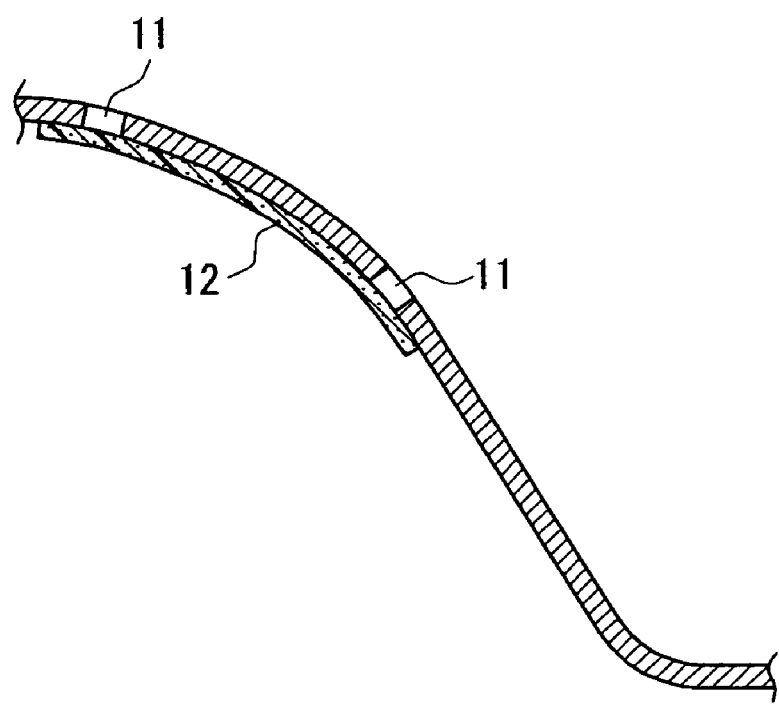
FIG. 7 is a cross-sectional view showing a schematic construction of a part of a waterproof case according to another embodiment of the present invention.

For example, as shown in FIG. 7, the breathing holes 11 can be provided in a smoothly curved portion of the waterproof case at different positions in a direction perpendicular to a horizontal direction of the electronic component. In this case, the breathing holes 11 are opened at different direction. Even in this case, the filter 12 having a waterproof property while being breathable can be attached to an inner surface of the waterproof case to cover the breathing holes 11.

Although an example in which the breathing holes 11 and the waterproof filter 12 are provided on the cover member 10 of the waterproof case has been described in the above embodiment, the present invention is not limited to this. For example, the breathing holes 11 and the waterproof filter 12 may be provided on the base member 40 of the waterproof case. Moreover, when a box-shaped case which is open on one side is used as the waterproof case, the object of the present invention can be achieved by providing the breathing holes 11 and the waterproof filter 12 in any position of this box-shaped case.

Moreover, although an example in which the waterproof filter 12 is fitted directly to the cover member 10 so as to cover the breathing holes 11 has been described in this embodiment, the present invention is not limited to this. For example, the waterproof filter 12 may be fitted to the cover member 10 by the use of a breathing member having a through hole and for closing this through hole. In this case, by inserting the breathing member having the waterproof filter 12 into the breathing holes 11 of the waterproof case, the waterproof filter 12 can be easily fitted to a position corresponding to the breathing holes 11. That is, the waterproof filter 12 can be fitted to a position corresponding to the breathing holes 11 via a breathing member.

In the above-described embodiment and modified examples, the shapes of the breathing holes 11 and the breathable waterproof filter 12 can be suitably changed when a case member (10, 40) for housing an electronic component has a plurality of breathing holes 11, and when the breathable waterproof filter 12 is fitted to the case member (10, 40) at a position corresponding to the breathing holes 11.

Such changes and modifications are to be understood as being within the scope of the present invention as defined by the appended claims.

What is claimed is:

1. A waterproof case for housing an electronic component, comprising:
    a case member that has a plurality of breathing holes; and
    a breathable waterproof filter fitted to the case member at a position corresponding to the breathing holes to cover the breathing holes, wherein
    the breathing holes are formed in at least two different wall surfaces among a plurality of wall surfaces defining an inner space of the case member for housing the electric component, wherein the openings of at least two of the breathing holes face in different directions, and
    the waterproof filter is made of a single sheet member which covers the breathing holes facing in a different direction.

2. The waterproof case as in claim 1, wherein:
    the case member includes a plurality of wall surfaces defining an inner space for housing the electronic component.

3. The waterproof case as in claim 2, wherein each of the wall surfaces is provided with at least one breathing hole.

4. The waterproof case as in claim 1, wherein:
    the case member includes a plurality of wall surfaces defining an inner space for housing the electronic component; and
    the breathing holes are opened in at least two opposite wall surfaces of the plurality of wall surfaces.

5. The waterproof case as in claim 1, wherein the breathing holes are provided at different positions in a direction perpendicular to a horizontal direction of the electronic component mounted in the case member.

6. The waterproof case as in claim 1, wherein the breathing hole has an open area on a side of the breathable waterproof filter, which is larger than an open area of the breathing hole on a side opposite to the breathable waterproof filter, in the case member.

7. The waterproof case as in claim 1, wherein:
    the case member has a triangular pyramid portion projecting to an outside of the case member; and
    the triangular pyramid portion is provided with an opening at a bottom part to form the breathing hole.

8. A waterproof case for housing an electronic component, comprising:
    a case member that has a plurality of breathing holes; and
    a breathable waterproof filter fitted to the case member at a position corresponding to the breathing holes to cover the breathing holes,
    wherein the case member has a wall portion defining a circular projecting groove projecting to an outside of the case member,
    wherein the breathing holes are provided in the wall portion and have openings at an outside of the circular projecting groove, and
    wherein the waterproof filter is made of a single sheet member which covers all of the breathing holes.

9. The waterproof case as in claim 8, wherein the breathing hole has openings in four outside directions of the circular projecting groove projecting to the outside of the case member.

10. The waterproof case as in claim 1, wherein:
    the breathing holes are through holes penetrating through a wall portion of the case member; and
    the waterproof filter is a sheet member that covers one-side openings of the through holes.

11. The waterproof case as in claim 1, wherein the waterproof filter is provided inside the case member.

12. The waterproof case as in claim 1, wherein the breathing holes are provided in the case member close to each other.

13. The waterproof case as in claim 1, wherein:
    the breathing holes are through holes penetrating through a wall portion of the case member; and
    the waterproof filter is fitted to the case member to cover the through holes.

14. The waterproof case as in claim 1, wherein the electronic component is provided with an atmospheric pressure sensor for detecting an atmospheric pressure.

15. The waterproof case as in claim 1, wherein the case member is constructed of a plurality of wall portions which are connected to each other.

16. The waterproof case as in claim 1, wherein:
    each of the breathing holes has a dimension capable of passing through water; and
    the waterproof filter is provided such that gas communicates with each other between an inside of the case member and an outside of the case member through the waterproof filter and at least one of the breathing holes.

17. The waterproof case according to claim 1, wherein the waterproof filter made of the single sheet member covers all of the breathing holes.

18. The waterproof case as in claim 8, wherein the waterproof filter is provided inside the case member.

19. The waterproof case as in claim 8, wherein the electronic component is provided with an atmospheric pressure sensor for detecting an atmospheric pressure.

20. The waterproof case as in claim 8, wherein:
    each of the breathing holes has a dimension capable of passing through water; and
    the waterproof filter is provided such that gas communicates with each other between an inside of the case member and an outside of the case member through the waterproof filter and at least one of the breathing holes

* * * * *